United States Patent [19]

Endo et al.

[11] Patent Number: 6,071,797

[45] Date of Patent: Jun. 6, 2000

[54] METHOD FOR FORMING AMORPHOUS CARBON THIN FILM BY PLASMA CHEMICAL VAPOR DEPOSITION

[75] Inventors: Kazuhiko Endo; Toru Tatsumi, both of Tokyo, Japan

[73] Assignee: NEC Corporation, Tokyo, Japan

[21] Appl. No.: 08/719,958

[22] Filed: Sep. 24, 1996

[30] Foreign Application Priority Data

Oct. 12, 1995 [JP] Japan .................................. 7-264177

[51] Int. Cl.⁷ ...................................................... H05H 1/00
[52] U.S. Cl. ........................ 438/488; 438/758; 438/778; 438/905; 438/931; 427/577; 134/1.1
[58] Field of Search .................... 437/101, 225; 438/905, 758, 778; 427/577; 134/1.1

[56] References Cited

U.S. PATENT DOCUMENTS

| | | | |
|---|---|---|---|
| 4,529,474 | 7/1985 | Fujiyama | 156/643 |
| 4,784,874 | 11/1988 | Ishihara et al. | 427/49 |
| 4,830,702 | 5/1989 | Singh et al. | 156/613 |
| 4,842,683 | 6/1989 | Cheng et al. | 156/345 |
| 5,198,263 | 3/1993 | Stafford et al. | 427/577 |
| 5,252,178 | 10/1993 | Moslehi | 134/1.1 |
| 5,269,881 | 12/1993 | Sekiya | 156/643 |
| 5,271,963 | 12/1993 | Eichman | 427/248.1 |
| 5,472,508 | 12/1995 | Saxena | 118/723 E |
| 5,477,975 | 12/1995 | Rice et al. | 217/68 |
| 5,531,834 | 7/1996 | Ishizuka et al. | 118/723 I |
| 5,562,776 | 10/1996 | Sapru et al. | 118/723 |
| 5,582,947 | 12/1996 | Shirai et al. | 430/128 |
| 5,585,012 | 12/1996 | Wu | 216/71 |
| 5,601,883 | 2/1997 | Yamazaki | 427/577 |
| 5,811,356 | 9/1998 | Murugesh et al. | 438/711 |
| 5,817,534 | 10/1998 | Ye | 438/10 |
| 5,879,575 | 3/1999 | Tepman | 216/68 |

FOREIGN PATENT DOCUMENTS

| | | |
|---|---|---|
| 3442208 | 5/1986 | Germany . |
| 3807112 | 9/1988 | Germany . |
| 3-82020 | 4/1991 | Japan . |
| 3-183128 | 8/1991 | Japan . |
| 3-211279 | 9/1991 | Japan . |
| 4-152515 | 5/1992 | Japan . |
| 4-186615 | 7/1992 | Japan . |
| 4-262530 | 9/1992 | Japan . |
| 5-211125 | 8/1993 | Japan . |
| 5-217910 | 8/1993 | Japan . |

Primary Examiner—Charles Bowers
Assistant Examiner—Matthew Whipple
Attorney, Agent, or Firm—Sughrue, Mion, Zinn, Macpeak & Seas, PLLC

[57] ABSTRACT

In a method of forming an amorphous carbon thin film with a plasma chemical vapor deposition method, at least one of a hydrocarbon gas and a carbon fluoride gas is supplied in a reaction chamber as a material gas. By applying a high voltage between two electrodes, a plasma is generated in the reaction chamber using the supplied material gas. As a result, an amorphous carbon thin film is deposited on a substrate while preventing deposition of an adhesion on an inner wall of the reaction chamber. In order to prevent the adhesion from depositing on the inner wall, a bias voltage such as one of DC bias, a high frequency bias and a high frequency bias imposed on a DC bias is applied to the electrically conductive reaction chamber.

16 Claims, 6 Drawing Sheets

METHOD FOR FORMING AMORPHOUS CARBON THIN FILM BY PLASMA CHEMICAL VAPOR DEPOSITION

BACKGROUND OF THE INVENTION

1. Field of the Invention

The present invention relates to a method and apparatus for forming a thin film by a plasma enhanced chemical vapor deposition method (plasma CVD method), and more particularly to a method and apparatus for forming a thin film, in which an amorphous carbon thin film is formed while a deposition of adhesion on the inner wall of a reaction chamber is prevented.

2. Description of Related Art

In manufacturing of a semiconductor device, an amorphous carbon thin film is used as a low dielectric constant insulation material and so on and is formed by the plasma chemical vapor deposition method for example. FIG. 1 is a cross sectional view showing the structure of a conventional parallel plates type plasma enhanced chemical vapor deposition apparatus which is used to form the amorphous carbon film.

Referring to FIG. 1, in the chemical vapor deposition apparatus, a reaction chamber is composed of a support base 111, a cylindrical side wall 112 which is arranged on the support base 111, and an upper lid 113 provided to oppose to the support base 111 and to close the other end of the cylindrical side wall 112. An exhaust pipe 118 is attached to the side wall 112 to be connected to a vacuum pump 117. A gas introducing pipe 121 for introducing a material gas into the reaction chamber penetrates the side wall 112. The gas introducing pipe 121 has an opening in the reaction chamber at one end and the other end is connected via a control valve 120 to a gas cylinder 119 as a gas supply source. A lower plate electrode 114 and an upper plate electrode 115 are arranged in parallel to each other and to oppose to each other in the reaction chamber. A substrate 122 on which the amorphous carbon film will be formed is mounted on the lower electrode 114. The upper electrode 115 is grounded and a predetermined voltage is applied to the lower electrode 114 by a high voltage power supply 116.

When an amorphous carbon thin film is formed using the plasma enhanced chemical vapor deposition apparatus, the pressure in the reaction chamber is reduced to a predetermined value by the vacuum pump 117. At the same time, a material gas is supplied from the gas cylinder 119 into the reaction chamber through the gas introducing pipe 121. Then, high frequency electric power is applied between the upper electrode 115 and the lower electrode 114 from the high voltage power supply 116 so that high frequency plasma discharge can be generated. As the material gas, there is used a gas which contains, for example, a hydrocarbon gas or a carbon fluoride gas as a main component. At this time, the side wall 112 is kept at a temperature equal to about room temperature. As a result, an adhesion is deposited on the inner wall of the reaction chamber.

This adhesion acts as a generation source of an impurity gas when a semiconductor thin film is manufactured. Also, if the adhesion is peeled down from the inner wall of the reaction chamber onto the semiconductor substrate during forming of the thin film, defects are caused which form a pattern on the substrate, resulting in a decrease in the manufacturing yield. Further, the film quality of the thin film formed changes, because the state of the plasma to be generated differs between the case that there is not adhesion on the inner wall of the reaction chamber and the case that there is the adhesion on the inner wall, so that active particles differ.

Actually, the deposition of the adhesion of this type and the generation of particles derived from the adhesion have been a general problem in the chemical vapor deposition method. Conventionally, the problem has been avoided by mechanically wiping the inner wall of the reaction chamber using organic solvent and so on to remove the adhesion. Alternatively, the inner wall of the reaction chamber is made to be detachable and the inner wall is replaced when the semiconductor substrates of a predetermined number is processed. Further, there has been used a method in which etching plasma is generated in the reaction chamber so that the adhesion on the inner wall is removed.

For example, there is disclosed in the Japanese Laid Open Patent Disclosure (Heisei 3-82020) the technique in which a ring member is provided in a reaction chamber of a thermochemical vapor deposition apparatus and an inner wall of the reaction chamber is heated such that the ring member is maintained at a temperature lower than that of the inner wall, so that a fine particle reaction product is made to be adhered to the ring member by thermal migration, resulting in suppression of deposition of the adhesion to the other part of the inner wall.

In the Japanese Laid Open Patent Disclosure (Heisei 3-183128) there is disclosed the technique in which an electrode for removing adhesion and a movable separating member are provided in a reaction chamber of the plasma chemical vapor deposition apparatus and adhesion deposited on the separating member is removed by plasma cleaning using the electrode for removing the adhesion.

In Japanese Laid Open Patent Disclosure (Heisei 3-211279) there is disclosed the technique in which in an atmospheric chemical vapor deposition apparatus in which silane gas and oxygen gas are introduced to form a $SiO_2$ thin film, an exhaust duct and gas dispersion head are heated to 200° C. to 300° C. so that deposition of adhesion (powder of $SiO_2$) to the exhaust duct and gas dispersion head is reduced.

In Japanese Laid Open Patent Disclosure (Heisei 4-152515) there is disclosed the technique in which in a decompression chemical vapor deposition apparatus, which is constituted such that a reaction pipe is he ate d to a temperature as high as a thin film formation temperature, unevenness from 10 μm to 500 μm is provided in the inner wall of the reaction pipe so that a film deposited on the inner wall of the reaction pipe can be prevented from peeling.

In Japanese Laid Open Patent Disclosure (Heisei 4-186615) there is disclosed the technique in which a third electrode is provided in a reaction chamber in a plasma chemical vapor deposition apparatus a nd plasma etch ing is performed using the third electrode so that adhesion is removed from the inner wall of the reaction chamber.

In Japanese Laid Open Patent Disclosure (Heisei 4-262530) there is disclosed the technique in which in a thermochemical vapor deposition apparatus in which the first reaction gas (e.g., tetraethoxysilane gas) and ozonic ($O_3$) gas are introduced to form a thin film of $SiO_2$, deposition of adhesion is reduced by introducing a second reaction gas (e.g., ethylene gas) reacting with oxygen radicals and by heating the wall of the reaction chamber.

In the Japanese Laid Open Patent Disclosure (Heisei 5-211125) there is disclosed the technique in which in a thermochemical vapor deposition apparatus, the inner wall of a reaction chamber is heated to 50 to 200° C. such that the adhesion deposited on the inner wall of the reaction chamber is sublimated and removed in vacuum.

Further, in Japanese Laid Open Patent Disclosure (Heisei 5-217910) there is disclosed the technique in which in a thermochemical vapor deposition apparatus in which a compound semiconductor thin film of GaAs or the like is formed using a reaction pipe having the double pipe structure to circulate cooling water, the reaction pipe is divided in three portions along the direction in which a reaction gas flows such that there can be removed the adhesion deposited on the inner wall of the middle one of the three divided portions of the reaction pipe by flowing cooling water through both of end portions of the reaction pile and by heading the middle portion.

As mentioned above, in the plasma enhanced chemical vapor deposition apparatus, it is required to regularly remove the adhesion deposited on the inner wall of the reaction chamber.

For this purpose, the apparatus must be maintained for every predetermined time period. Further, the method is performed in which the conditions of temperature and reaction gas are changed such that the deposition of unnecessary adhesion can be reduced. In the above methods, however, the conditions must be set in accordance with a kind of film to be formed and so on. The condition when an amorphous carbon thin film is formed by the plasma enhanced chemical vapor deposition method does not yet become clear.

SUMMARY OF THE INVENTION

An object of the present invention is to solve the above-mentioned problems and to provide a method for forming a thin film such as an amorphous carbon thin film by the plasma enhanced chemical vapor deposition method while the deposition of adhesion to the inner wall of a reaction chamber is prevented so that maintenance is not required.

In order to achieve an aspect of the present invention, a method of forming a thin film with a plasma chemical vapor deposition method, includes the steps of:

supplying a material gas into a reaction chamber;

generating a plasma in the reaction chamber using the supplied material gas; and depositing an amorphous carbon thin film on a substrate while preventing deposition of an adhesion on an inner wall of the reaction chamber.

In this case, at least a part of the inner wall of the reaction chamber is heated to a temperature equal to or higher than 200° C. such that adhesion coefficient of the adhesion is 0 so that the deposition of the adhesion on the inner wall of the reaction chamber is prevented. It is desirable that the reaction chamber is made from a material having a thermal conductivity sufficient to unify a temperature of the whole of the reaction chamber, e.g., aluminum. Alternatively, a bias voltage may be applied to the electrically conductive reaction chamber such that the deposition of the adhesion to the inner wall of the reaction chamber is prevented. In this case, the applied bias voltage is one of DC bias, a high frequency bias and a high frequency bias imposed on a DC bias.

In a case where an amorphous carbon thin film is formed, the material gas includes at least one of hydrocarbon gas or a carbon fluoride. Also, the amorphous carbon thin film further includes at least one element selected from the group consisting of hydrogen, fluorine, nitrogen and silicon.

DESCRIPTION OF THE PREFERRED EMBODIMENTS

Next, an apparatus for forming a thin film such as an amorphous carbon thin film using a plasma chemical vapor deposition method of the present invention will be described with reference to the drawings.

Figure 1:
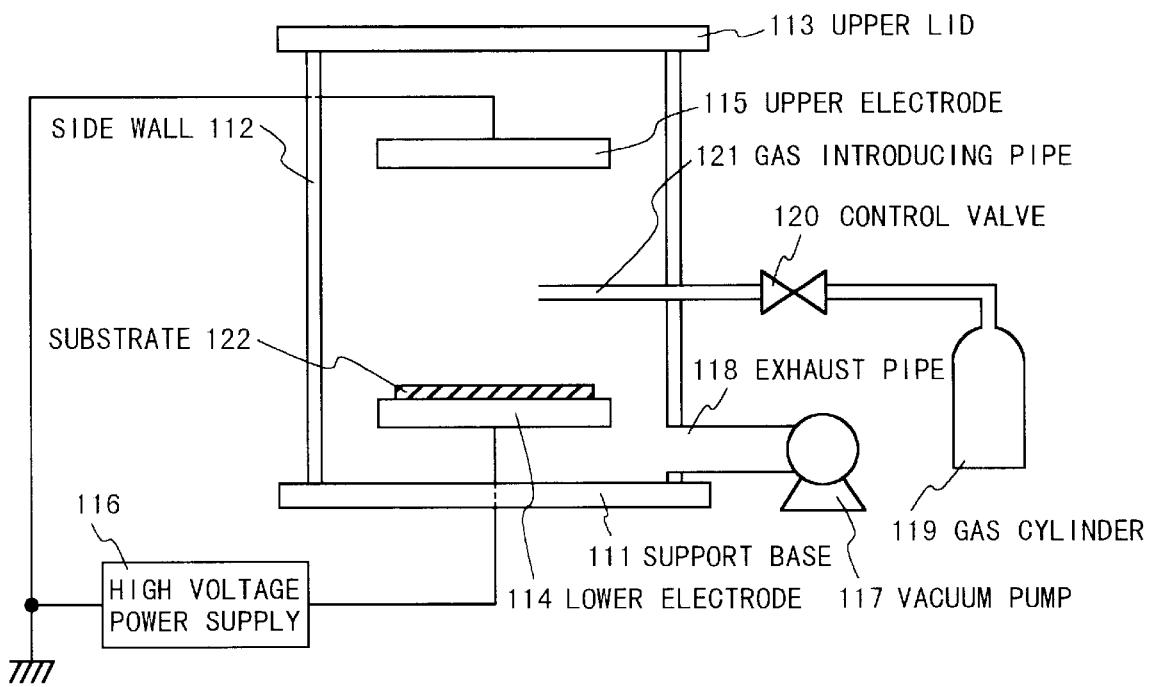
FIG. 1 is a schematic diagram illustrating the structure of a conventional parallel plate type plasma enhanced chemical vapor deposition apparatus which is used to form an amorphous carbon thin film.
Figure 2:
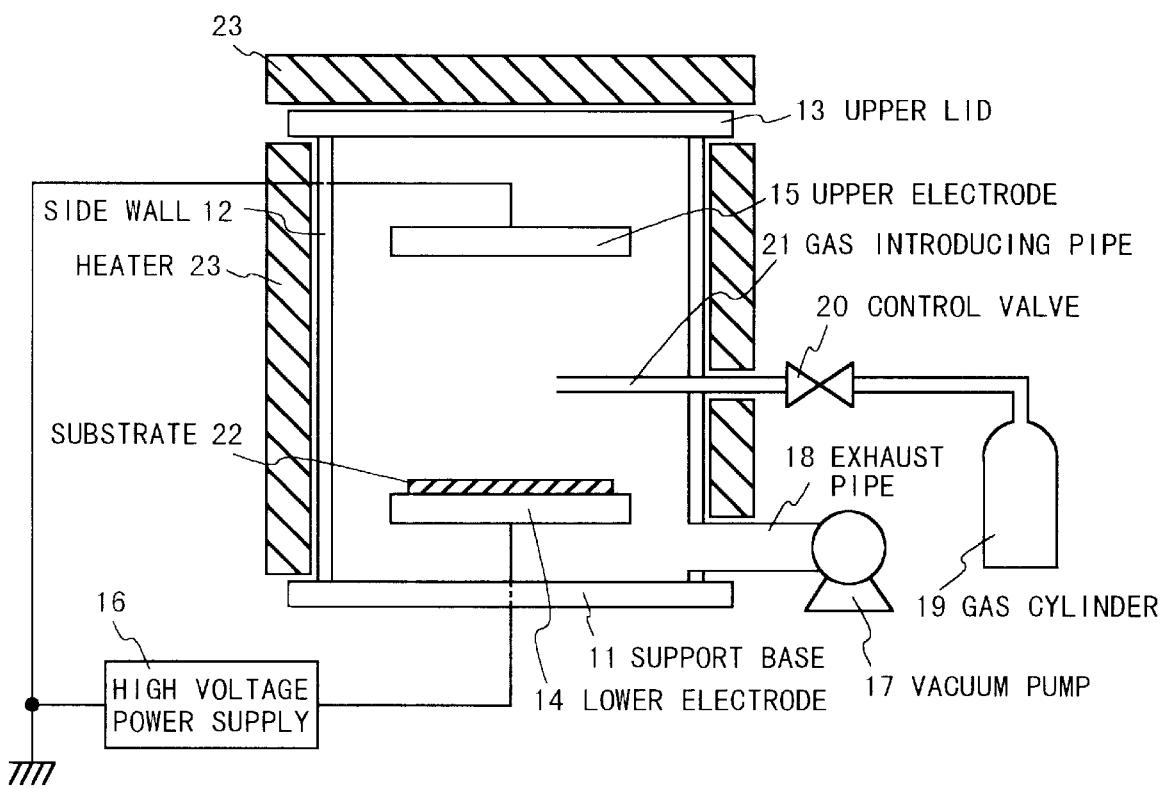
FIG. 2 is a schematic diagram illustrating the structure of a parallel plate type plasma chemical vapor deposition apparatus according to a first embodiment of the present invention.

FIG. 2 is a cross sectional view which shows the structure of a plasma enhanced chemical vapor deposition apparatus according to the first embodiment of the present invention. This chemical vapor-phase growth equipment is used to form an amorphous carbon thin film on a substrate 22.

Referring to FIG. 2, in the chemical vapor deposition apparatus, a reaction chamber is composed of a support base 11, a cylindrical side wall 12 which is arranged on the support base 11, and an upper lid 13 provided to oppose to the support base 11 and to close the other end of the cylindrical side wall 12. An exhaust pipe 18 is attached to the side wall 12 to be connected to a vacuum pump 17. A gas introducing pipe 21 for introducing a material gas into the reaction chamber penetrates the side wall 12. The gas introducing pipe 21 has an opening in the reaction chamber at one end and the other end is connected via a control valve 20 to a gas cylinder 19 as a gas supply source. A lower plate electrode 14 and an upper plate electrode 15 are arranged in parallel to each other and to oppose to each other in the reaction chamber. A substrate 22 for the amorphous carbon film to be formed is mounted on the lower electrode 14. The upper electrode 15 is grounded and a predetermined voltage is applied to the lower electrode 14 by a high voltage power supply 16. The reaction chamber further includes a heater 23 which is added around the side wall 12 and on the upper lid 13 such that the heater 23 covers the outside of the reaction chamber, i.e., covers these side walls 12 and the upper lid 13. The heater 23 is used to heat the wall of a reaction chamber, especially the inner surface of a side wall 12 and an upper lid 13 where deposition of adhesion becomes a problem, to a predetermined temperature, for example, a temperature equal to or higher than 200° C.

Next, the film formation of the amorphous carbon thin film using this chemical vapor-phase growth equipment will be described. As a material gas, a hydrocarbon gas of $CH_4$ is used for example. When a film containing fluorine is to be deposited, a carbon fluoride gas of $CF_4$ and so on is used as the material gas. The hydrocarbon gas and carbon fluoride gas may be properly mixed. If the amorphous carbon thin film which contains nitrogen or silicon is to be formed, a $N_2$ gas or a silane group gas such as $SiH_4$ and $Si_2H_6$ and so on should be added to these material gases. Then, the inside of the reaction chamber is decompressed by the vacuum pump 18 via the exhaust pipe 18. The material gas is introduced from the gas cylinder 19 into the reaction chamber via the control valve 20. The inner wall of the reaction chamber is heated to a temperature equal to or higher than 200° C. by the heater 23. High frequency electric power is applied between a lower electrode 14 and an upper electrode 15 by the high voltage power supply 16 so that plasma discharge is generated. Thereby, an amorphous carbon thin film is formed on the substrate 22 mounted on lower electrode 14 while preventing any adhesion from depositing on the inner wall of the reaction chamber. In this case, because any adhesion is not deposited on the inner wall of the reaction chamber and active particles generated by the plasma discharge can be effectively used for the deposition on the substrate 22, the thin film such as the amorphous carbon thin film can be grown with good quality and high growth rate. In this example, the high frequency discharge is used as a plasma generating source. However, direct current discharge, microwave discharge, and helicon wave discharge can be also used as the plasma. The present invention can use these plasma sources.

Figure 3:
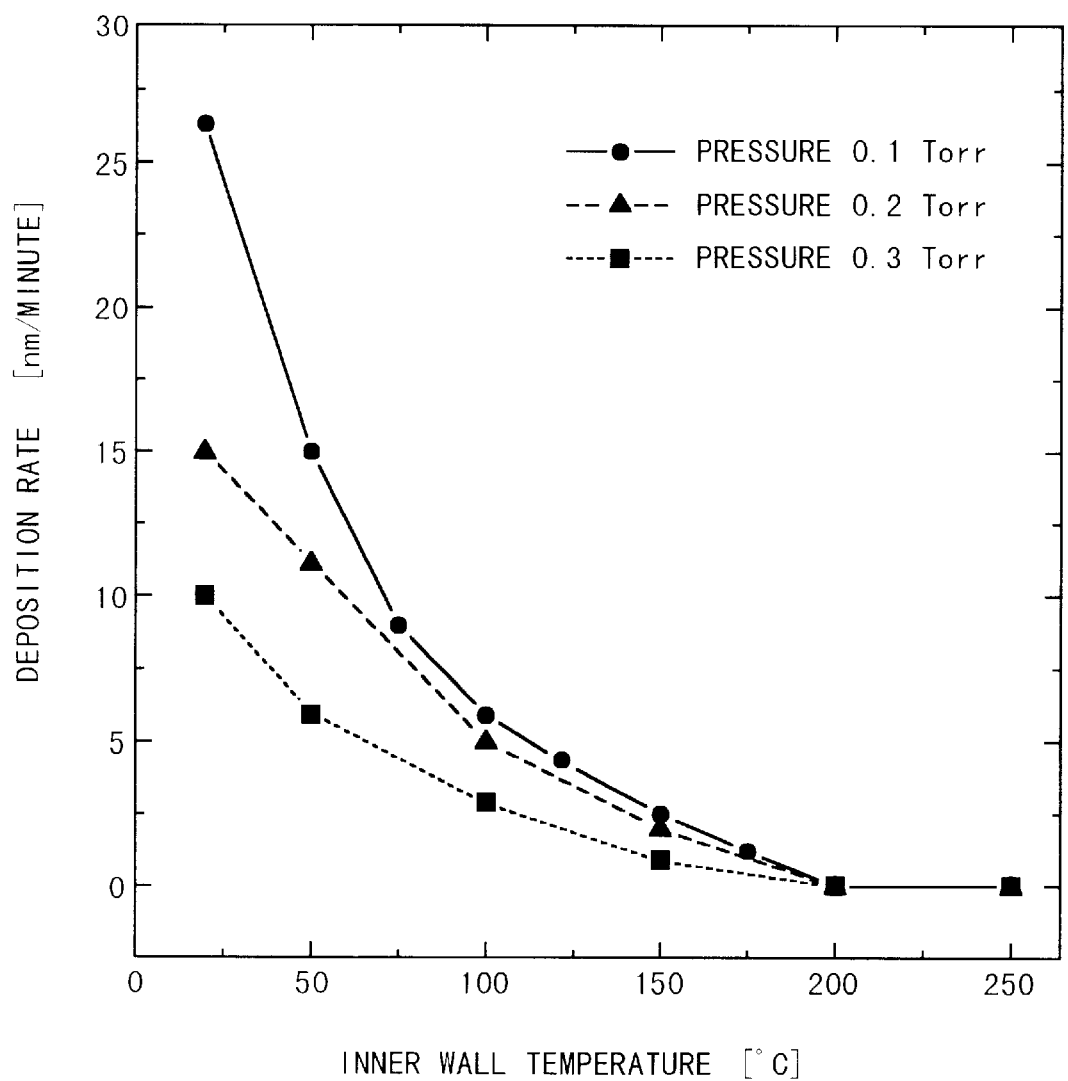
FIG. 3 is a graph showing the temperature dependency of deposition rate of adhesion to a side wall of a reaction chamber when the pressure in the reaction chamber is varied.
Figure 4:
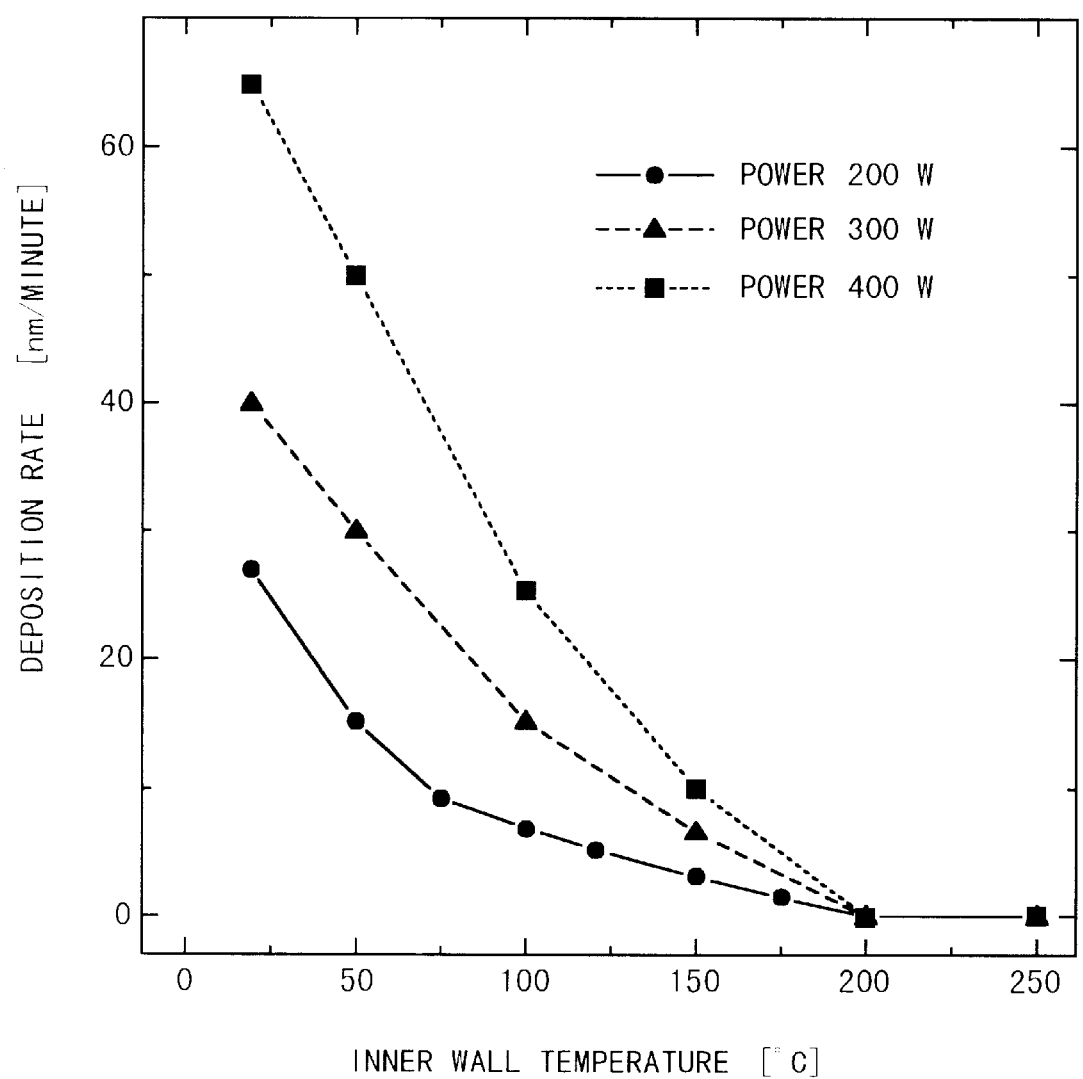
FIG. 4 is a graph showing the temperature dependency of deposition rate of adhesion to the side wall of the reaction chamber when power used to generate plasma is varied.

Next, the reason for setting the temperature of the inner wall of the reaction chamber to a temperature equal to or higher than 200° C. will be explained. FIGS. 3 and 4 show the measuring results of the temperature dependency of the film deposition rate to the side wall of the reaction chamber when the methane ($CH_4$) is used as the material gas and an amorphous carbon thin film is formed by the parallel plate type plasma chemical vapor deposition apparatus. FIG. 3 shows the experimental results when the electric power (source electric power) for the plasma generation is fixed on 200 W and the internal pressure of the reaction chamber is 0.1, 0.2, 0.3 Torr, respectively. FIG. 4 shows the experimental results when the internal pressure of the reaction chamber is fixed on 0.1 Torr and the source electric power is set to 100, 200, 300 W, respectively. From these experiment results, it is found that the deposition rate decreases as the temperature of the side wall increases and the adhesion probability of the thin film (adhesion) to the side wall becomes 0 when the temperature of the side wall reaches 200° C.

This shows that the probability of adhesion to the substrate and to the inner walls of the reaction chamber of the film formation active particles which are activated by the plasma is greatly dependent on temperature. The probability of adhesion to the inner wall of the reaction chamber is made to be substantially 0 at about 200° C. Also, as shown in FIGS. 3 and 4, the temperature that the adhesion to the side wall becomes 0 is constant at 200° C. without undergoing the influence of the high frequency electric power (the source electric power) or the pressure. From these results, it could be considered that even if the source electric power and pressure are changed so that the kind and density and so on of the active particles in the plasma are changed, the adhesion coefficient of any of those active particles would become 0 at 200° C. Therefore, if the inner wall of the reaction chamber is heated to a temperature equal to or higher than 200° C., no deposition of the adhesion to the inner wall would be generated. Actually, when the whole inner wall of the reaction chamber was heated to 200° C. and an amorphous carbon thin film was formed, deposition of adhesion to the inner wall of the reaction chamber could be prevented.

When a gas other than the methane gas is used as the material gas, the temperature dependency of adhesion to the inner wall was established in the same manner as mentioned above. That is, in either case of using a hydrocarbon gas such as $C_2H_6$, $C_2H_4$, $C_2H_2$, or $C_6H_6$ and a carbon fluoride gas such as $CF_4$, $C_2F_6$, or $C_4F_6$ as the material gas, the adhesion probability of a film to the inner wall became 0 when the wall temperature became 200° C. Also, when the whole wall of the reaction chamber was heated to 200° C. and an amorphous carbon thin film was formed using these material gases, adhesion to the inner wall of the reaction chamber could be prevented. The same result was obtained in a case where a $N_2$ gas, or a $SiH_4$ gas, a $Si_2H_6$ gas were added to the material gas and an amorphous carbon thin film which contained nitrogen or silicon was formed. Further, in the plasma chemical vapor deposition apparatus using direct current discharge, microwave discharge, helicon wave discharge, when the reaction chamber was heated to 200° C. in the same manner as described above, the adhesion of a film to the inner wall of the reaction chamber could be prevented.

Next, the material which constitutes the reaction chamber will be described. When the reaction chamber of the chemical vapor deposition apparatus shown in FIG. 2 is made of stainless steel, because a thermal conductivity of stainless steel is small and heat conduction from the heater 23 is different in different places, so that a portion of the inner wall of the reaction chamber cannot be raised to 200° C., the deposition of adhesion is seen only about that portion. For this reason, in a case where the reaction chamber is made from stainless steel, the heating temperature of the reaction chamber is set to 250° C. such that the whole inner wall of the reaction chamber is heated to a temperature equal to or higher than 200° C. This is the case even if a portion of the inner wall of the reaction chamber has a lower temperature due to the change of thermal conduction at that location. As a result, the film deposition to the inner wall of the reaction chamber can be totally suppressed.

On the other hand, the reaction chamber may be made from aluminum which has a great thermal conductivity and is heated to 200° C. by the heater 23. As a result, the whole reaction chamber is uniformly heated to 200° C. In this state, an amorphous carbon thin film is formed. As a result, the film deposition to the inner wall of the reaction chamber is not seen. In this manner, if the reaction chamber is made from metal with a great thermal conductivity, the deposition of adhesion to the inner wall of the reaction chamber can be totally prevented at a temperature lower than in a case where the reaction chamber is made from stainless steel.

Figure 5:
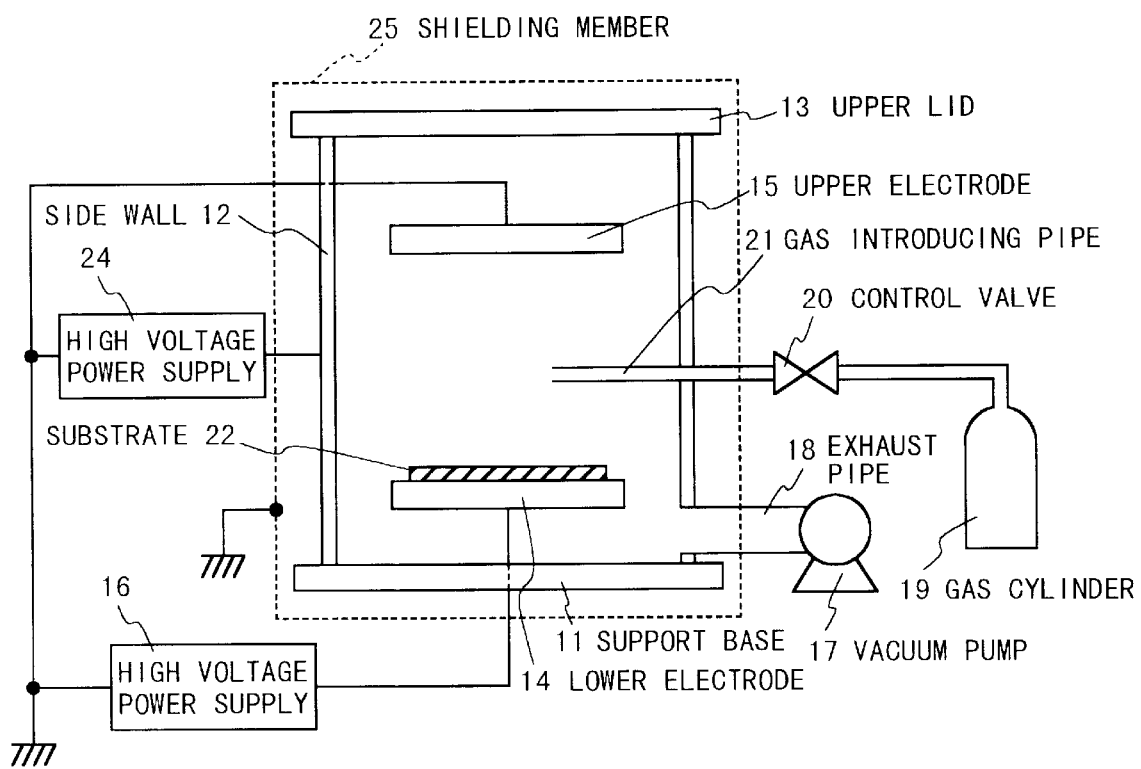
FIG. 5 is a schematic diagram illustrating the structure of the parallel plate type plasma chemical vapor deposition apparatus according to a second embodiment of the present invention.

FIG. 5 is a cross sectional view which shows the structure of the plasma chemical vapor deposition apparatus according to the second embodiment of the present invention. This chemical vapor deposition apparatus is used to form an amorphous carbon thin film on a substrate 22. In the parallel plate type plasma chemical vapor deposition apparatus according to the second embodiment, the heater 23 is removed from the plasma chemical vapor deposition apparatus shown in FIG. 2. The reaction chamber is made from electrically conductive metal such as stainless steel and aluminum in the second embodiment. Further, the plasma chemical vapor deposition apparatus according to the second embodiment is constituted in such a manner that a bias voltage can be applied to the reaction chamber by a high voltage power supply 24. The bias voltage is DC voltage or high frequency voltage. Further, in addition to the high voltage power supply 24, there is provided a shield member 25 which is constituted of metallic network which surrounds the whole reaction chamber and is grounded.

Next, the formation of an amorphous carbon thin film using the chemical vapor deposition apparatus will be described. As a material gas, is used a hydrocarbon gas such as $CH_4$ and so on or a carbon fluoride gas such as $CF_4$ and so when the film containing fluorine is to be formed. The hydrocarbon gas and the carbon fluoride may be properly mixed. If the amorphous carbon thin film which contains nitrogen or silicon is to be formed, a $N_2$ gas or a silane group gas such as $SiH_4$ and $Si_2H_6$ and so on should be added to these material gases. Then, the inside of the reaction chamber is decompressed by the vacuum pump 17 via the exhaust pipe 18. The material gas is introduced from the gas cylinder 19 into the reaction chamber via the control valve 20. High frequency electric power is applied between the lower electrode 14 and the upper electrode 15 by the high voltage power supply 16 such that plasma discharge occurs. Further, a bias voltage of direct current or high frequency is applied to the whole reaction chamber by the high voltage power supply 24, so that the amorphous carbon thin film is formed on the substrate 22 mounted on the lower electrode 14 without depositing any adhesion to the inner wall of the reaction chamber. In this example, the high frequency electric power is applied between the lower electrode 14 and the upper electrode 15 such that the plasma is generated in the reaction chamber. However, it is possible to use direct current discharge, microwave discharge, helicon wave discharge as a plasma generation source. The present invention can be also applied to cases using these plasma sources.

Figure 6:
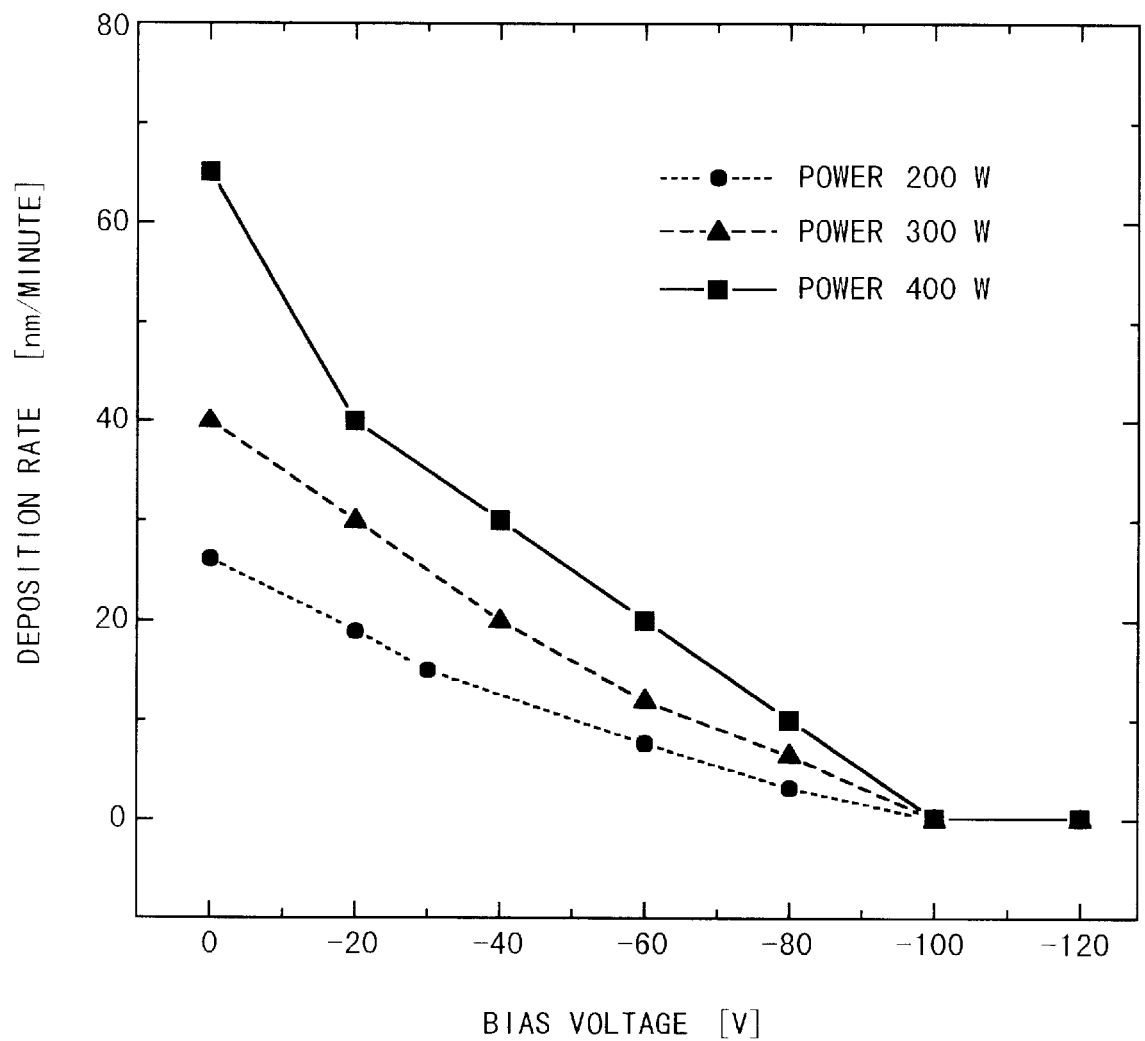
FIG. 6 is a graph showing the bias voltage dependency of deposition rate of adhesion to the side wall of the reaction chamber when power used to generate plasma is varied.

Next, the bias voltage applied to the reaction chamber will be described. FIG. 6 shows the adhesion rate of the amorphous carbon film to the inner wall of the reaction chamber when dc or ac: bias voltage is applied to the reaction chamber using the above-mentioned chemical vapor deposition apparatus. Thus, in a case where the amorphous carbon thin film is formed using a hydrocarbon gas such as $C_2H_6$, $C_2H_4$, $C_2H_2$, or $C_6H_6$ or a carbon fluoride gas such as $CF_4$, $C_2F_6$, or $C_4F_8$ as the material gas, it is found that the adhesion of the film to the inner wall of the reaction chamber can be prevented when the dc electric power or the high frequency electric power outputted from the high voltage power supply 24 is controlled such that the bias voltage equal to or less than −100 V can be applied to the reaction chamber. That is, by applying the dc or high frequency bias electric power to the inner wall of the reaction chamber in a case of formation of the film, ion particles which are generated by the plasma are accelerated and irradiated to the inner wall of the reaction chamber. As a result, etching and sputtering of the film which is adhered to the inner wall would be performed, so that the adhesion of the film to the inner wall is prevented. In this case, as illustrated in the figure, even if the plasma is generated using any source electric power, the deposition to the inner wall of the reaction chamber can be suppressed if the bias voltage equal to or less than −100 V is applied to the reaction chamber. That is, ions, which are accelerated by the bias voltage equal to or less than −100 V (being equal to or more higher 100 V at the absolute value so as) to have a high energy, contribute to the reduction of the adhesion coefficient to "0". It is shown that ions can be generated in the using same method, even if a different source electric power is used.

In a case in which a plasma source is employed (such as a direct current discharge type plasma source, a microwave type plasma source, helicon or a wave type plasma source) other than the parallel plate type plasma source, the adhesion of the film to the inner wall of the reaction chamber could be prevented in the same manner as described above by applying the bias voltage equal to or less than −100 V to the reaction chamber. The same result could be obtained in a case where a $N_2$ gas, or a gas of $SiH_4$ and $Si_2H_6$ were added to the material gas to from the amorphous carbon thin film which contains nitrogen or silicon.

According to the present embodiment, the particle generation can be prevented without cleaning the inside of the reaction chamber every predetermined constant time period. Also, although a part of the active particles is conventionally deposited on the side wall, because all the active particles are deposited only on the substrate, the film formation rate on the substrate can be increased by a factor of two.

As described above, in the present invention, when an amorphous carbon thin film is formed using the plasma enhanced chemical vapor deposition method, the reaction product can be prevented from adhering to the inner wall of the reaction chamber by heating the reaction chamber to a temperature or above at which the adhesion coefficient of the film formation active particle to the inner wall of the reaction chamber becomes 0, or by applying the direct current or high frequency bias voltage to the reaction chamber. In this manner, there is achieved the advantage that it is not necessary to perform regular removal of the adhesion from the reaction chamber, i.e., the effect to make maintenance free.

What is claimed is:

1. A method of forming a thin film using plasma chemical vapor deposition, comprising the steps of:

supplying a material gas into a reaction chamber;

generating a plasma in the reaction chamber using the material gas supplied into said reaction chamber;

depositing a film on a substrate in the reaction chamber; and controlling a characteristic of said reaction chamber during the step of depositing to prevent a deposition of an adhesion on an inner wall of the reaction chamber;

wherein said reaction chamber is electrically conductive; and wherein said depositing step comprises the step of:

applying to at least one inner wall of the reaction chamber, a bias voltage such that the deposition of the adhesion to the inner wall of the reaction chamber is prevented by etching of the adhesion as it is formed on the inner wall during deposition.

2. A method according to claim 1, wherein the reaction chamber is made from a material having a thermal conductivity sufficient to unify a temperature of the whole of the reaction chamber.

3. A method according to claim 2, wherein the reaction chamber is made from aluminum.

4. A method according to claim 1, wherein the film is an amorphous carbon thin film and the material gas includes at least one of a hydrocarbon gas and a carbon fluoride gas.

5. A method according to claim 4, wherein the amorphous carbon film includes at least one element selected from the group consisting of hydrogen, fluorine, nitrogen and silicon.

6. A method according to claim 1, wherein said applying step comprises the step of:

applying one of a DC bias, a high frequency bias and a high frequency bias imposed on a DC bias to the reaction chamber.

7. A method according to claim 1, wherein said film is an amorphous carbon film.

8. A method according to claim 1, wherein the film includes at least one element selected from the group consisting of hydrogen, fluorine, nitrogen and silicon.

9. A method according to claim 8, wherein said film is an amorphous carbon film.

10. A method of forming a thin film using plasma chemical vapor deposition, comprising the steps of:

supplying a material gas into a reaction chamber;

generating a plasma in the reaction chamber using the material gas supplied into said reaction chamber; and depositing a film on a substrate in the reaction chamber; and controlling a characteristic of said reaction chamber during the step of depositing to prevent a deposition of an adhesion on an inner wall of the reaction chamber;

wherein said film comprises an amorphous carbon film, and wherein said depositing step comprises the step of:

heating at least a part of an inner wall of the reaction chamber to a temperature of at least 200° C. such that the deposition of the adhesion is prevented.

11. A method according to claim 10, wherein the reaction chamber is made from a material having a thermal conductivity sufficient to unify a temperature of the whole of the reaction chamber.

12. A method according to claim 11, wherein the reaction chamber is made from aluminum.

13. A method of preventing an adhesion from being deposited on an inner wall of a reaction chamber during plasma chemical vapor deposition, comprising the steps of:

introducing a material gas into the reaction chamber;

heating at least a part of an inner wall of the reaction chamber to a predetermined temperature; and generating a plasma in the reaction chamber to deposit a film on a substrate;

wherein said film comprises an amorphous carbon film, and wherein said heating step comprises the step of:

heating at least a part of the inner wall of the reaction chamber to a temperature equal to or higher than 200° C.

14. A method of preventing an adhesion from being deposited on an inner wall of a reaction chamber during plasma chemical vapor deposition, comprising the steps of:

introducing a material gas into the reaction chamber;

applying a predetermined bias voltage to a surface of at least one inner wall of the reaction chamber to cause etching of the adhesion as it is formed on the inner wall during deposition; and generating a plasma in the reaction chamber to deposit a film on a substrate.

15. A method according to claim 14, wherein said film comprises an amorphous carbon film, and wherein the predetermined bias voltage is equal to or lower than −100 V.

16. A method of preventing an adhesion from being deposited on an inner wall of a reaction chamber during plasma chemical vapor deposition, comprising the steps of:

introducing a material gas into the reaction chamber;

applying a predetermined bias voltage to at least one inner wall of the reaction chamber to cause etching of the adhesion as it is formed on the inner wall during deposition; and generating a plasma to deposit a film on a substrate, said predetermined bias voltage being one of a DC voltage, a high frequency voltage and a high frequency voltage imposed on a DC voltage.

* * * * *